(12) United States Patent
Park

(10) Patent No.: US 8,505,389 B2
(45) Date of Patent: Aug. 13, 2013

(54) MASK DEFECT TESTING APPARATUS

(75) Inventor: Si-Young Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 12/762,555

(22) Filed: Apr. 19, 2010

(65) Prior Publication Data

US 2011/0061468 A1 Mar. 17, 2011

(30) Foreign Application Priority Data

Sep. 11, 2009 (KR) .................. 10-2009-0085852

(51) Int. Cl.
*G01N 3/08* (2006.01)

(52) U.S. Cl.
USPC ............................................. 73/831

(58) Field of Classification Search
USPC ............................................. 73/831
See application file for complete search history.

(56) References Cited

U.S. PATENT DOCUMENTS

| | | | |
|---|---|---|---|
| 6,729,927 B2 * | 5/2004 | Stagnitto et al. | 445/47 |
| 7,545,162 B2 * | 6/2009 | Chung | 324/760.01 |
| 7,948,247 B2 * | 5/2011 | Araki et al. | 324/705 |
| 2008/0186476 A1 | 8/2008 | Kusunose | |
| 2008/0239290 A1 | 10/2008 | Watanabe et al. | |

FOREIGN PATENT DOCUMENTS

| | | | |
|---|---|---|---|
| GB | 2 264 460 | | 9/1993 |
| JP | 3002290 U | | 9/1994 |
| JP | 2000030610 | * | 1/2000 |
| JP | 2000-173464 | | 6/2000 |
| JP | 2002-140989 | | 5/2002 |
| JP | 2004-037134 | | 2/2004 |
| JP | 2006-111941 | * | 4/2006 |
| JP | 2006-176809 | | 7/2006 |
| JP | 2006-249542 | * | 9/2006 |
| JP | 2006-260936 | | 9/2006 |
| JP | 2006-265712 | | 10/2006 |
| JP | 2009-092553 | | 4/2009 |
| JP | 2009-129728 | | 6/2009 |
| KR | 10-2004-0096277 | | 11/2004 |
| TW | 200508583 | | 3/2005 |

* cited by examiner

*Primary Examiner* — Lisa Caputo
*Assistant Examiner* — Octavia D. Hollington
(74) *Attorney, Agent, or Firm* — Christie, Parker & Hale, LLP

(57) ABSTRACT

A mask defect test apparatus, including a tension jig unit having a supporter on which a metal mask to be tested is located, a clamp part disposed at both sides of the supporter to fix opposite edges of the metal mask, and a tension part to apply a tension force to the metal mask fixed by the clamp part; and a test unit to test the metal mask fixed by the tension jig unit. A vertical distance between the metal mask located on the supporter and the test unit is less than or equal to a vertical distance between the tension jig unit and the test unit.

10 Claims, 2 Drawing Sheets

MASK DEFECT TESTING APPARATUS

CROSS-REFERENCE TO RELATED APPLICATIONS

This application claims the benefit of Korean Application No. 10-2009-0085852, filed in the Korean Intellectual Property Office on Sep. 11, 2009, the disclosure of which is incorporated herein by reference.

BACKGROUND OF THE INVENTION

1. Field of the Invention

Aspects of the present invention relate generally to a mask defect testing apparatus, and more specifically, to a mask defect testing apparatus that tests whether a mask used for a display panel manufacturing process is defective or not.

2. Description of the Related Art

Display panel manufacturing processes generally employ various kinds of masks. For example, a metal mask is used for precise processes. However, in some cases defects can occur, such as where fine foreign materials are attached to the metal mask, resulting in damage to the patterns in the mask. These defects can cause a large loss in all the manufacturing processes using the corresponding metal mask.

As a result, the presence of a defect of the metal mask should be regularly tested before or after the metal mask is used. One method of testing the defect of the metal mask involves fixing the metal mask to be tested to a jig and then testing the defect of the fixed metal mask using a test mask. At this time, as a camera more closely approaches a metal mask to be tested, the ability to detect damage to the pattern and foreign materials is improved.

However, since a clamp of a jig fixing an edge of the metal mask generally has a structure that protrudes upward, the test camera can only approach the metal mask fixed to the jig within a range that does not collide with the jig. In other words, due to the structure of the jig fixing the metal mask, the camera is limited in approaching the metal mask to be tested or testing an edge portion of the metal mask. Therefore, the presence of a defect of the metal mask is not precisely and stably tested.

SUMMARY OF THE INVENTION

Aspects of the present invention provide a mask defect testing apparatus that is capable of precisely and stably testing for presence of a defect of a metal mask.

According to an aspect of the present invention, a mask defect test apparatus is provided. The apparatus includes a tension jig unit having a supporter on which a metal mask to be tested is located, a clamp part disposed at both sides of the supporter to fix opposite edges of the metal mask, and a tension part to apply a tension force to the metal mask fixed by the clamp part; and a test unit to test the metal mask fixed by the tension jig unit, wherein a vertical distance between the metal mask located on the supporter and the test unit is less than or equal to a vertical distance between the tension jig unit and the test unit.

According to another aspect of the present invention, the metal mask located on the supporter is bent at the edge of the supporter at a predetermined angle such that the metal mask can be fixed to the clamp part.

According to another aspect of the present invention, the predetermined angle may be in the range of 10° to 30°.

According to another aspect of the present invention, a fixed surface of the clamp part fixing the edge of the metal mask may have a predetermined inclined angle with respect to the surface of the supporter on which the metal mask is located.

According to another aspect of the present invention, the predetermined inclined angle may be in the range of 10° to 30°.

According to another aspect of the present invention, the tension part may pull the clamp part to apply the tension force to the metal mask.

According to another aspect of the present invention, the mask defect test apparatus may further include a transfer unit to transfer one of the test unit or the tension jig unit in a parallel direction with respect to the other of the test unit or the tension jig unit.

According to another aspect of the present invention, the test unit includes a camera unit to detect the presence of a defect of the metal mask located on the supporter and an illuminating unit disposed around the camera part to illuminate the metal mask.

According to another aspect of the present invention, the vertical distance between the metal mask and the test unit is less than or equal to a vertical distance between the clamp parts and the test unit.

According to another aspect of the present invention, the vertical distance between the metal mask and the test unit is less than or equal to a vertical distance between the tension part and the test unit.

According to aspects of the present invention, the mask defect test apparatus can precisely and stably test for the presence of a defect of the metal mask.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
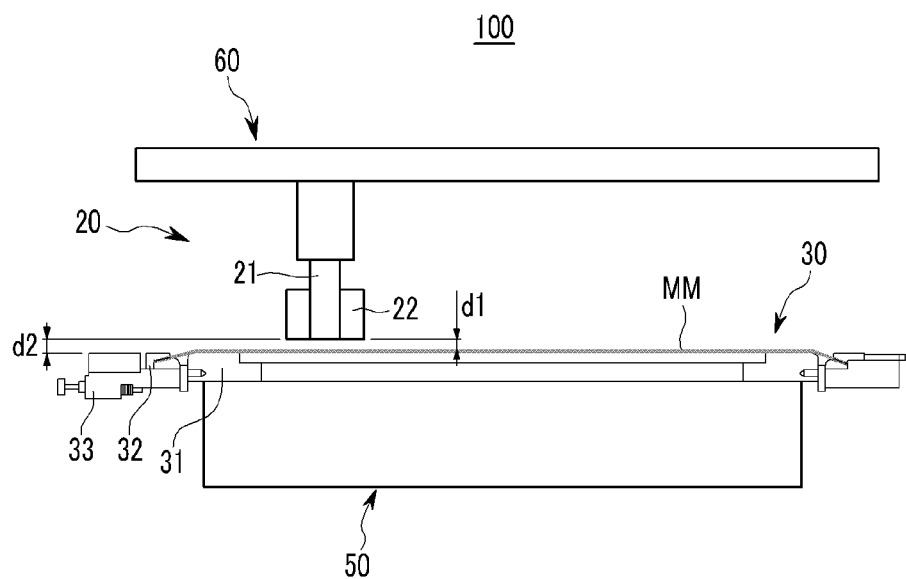
FIG. 1 is a front view of a mask test apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Further, since sizes and thicknesses of constituent members shown in the accompanying drawings are arbitrarily given for better understanding and ease of description, aspects of the present invention are not limited to the illustrated sizes and thicknesses. In the drawings, the thickness of layers, regions, etc., are exaggerated for clarity and ease of understanding. It will be understood that when an element such as a layer, film, region, or substrate is referred to as being "on" another element, it can be directly on the other element or separated by intervening elements.

Hereinafter, a mask defect test apparatus 100 according to an embodiment of the present invention will be described with reference to FIGS. 1 to 4. As shown in FIG. 1, the mask defect test apparatus 100 includes a tension jig unit 30 and a test unit 20. The mask defect test apparatus 100 may further include a base member 50 on which the tension jig unit 30 is mounted. According to other aspects of the present invention, the mask defect test apparatus 100 may include additional components.

Figure 2:
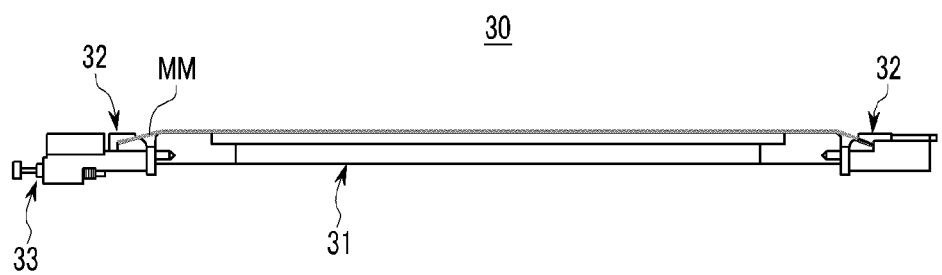
FIG. 2 is a front view of a tension jig unit of FIG. 1.
Figure 3:
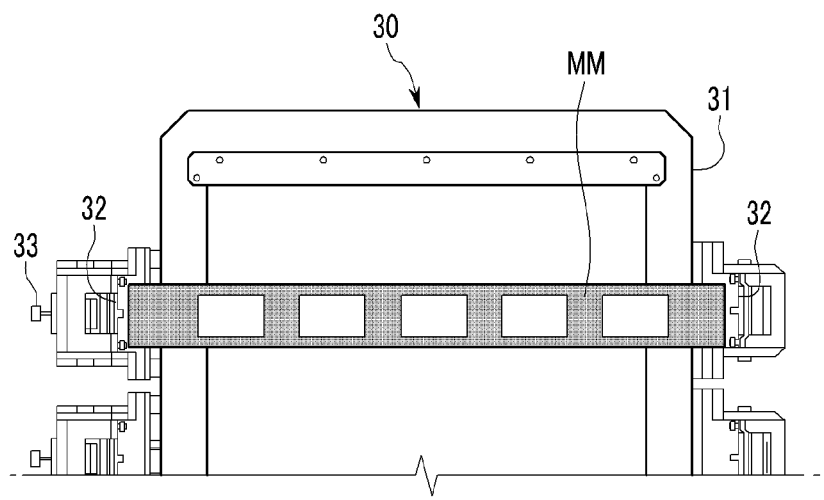
FIG. 3 is a partial plan view of the tension jig unit of FIG. 1.

As shown in FIGS. 2 and 3, the tension jig unit 30 includes a supporter 31, a clamp part 32, and a tension part 33. A metal mask (MM) to be tested is located on the supporter 31. The clamp part 32 is disposed at both sides of the supporter 31 to fix both edges of the metal mask (MM) located on the supporter 31. The tension part 33 pulls any one of a pair of clamp parts 32, which fix both sides of the metal mask (MM), to apply a tension force to the metal mask (MM) fixed by the clamp part 32. The clamp part 32 and the tension part 33 tightly fixes the metal mask (MM) on the supporter 31, making it possible for the test unit 20 to effectively test the metal mask (MM).

Referring again to FIG. 1, the test unit 20 includes a camera unit 22 and an illuminating unit 21. The camera unit 22 detects the presence of a defect of the metal mask (MM) located on the supporter 31 of the tension jig unit 30. The illuminating unit 21 is disposed around the camera unit 22 to irradiate light on the metal mask (MM) so that the camera unit 22 can more precisely detect the presence of a defect of the metal mask (MM). According to other aspects of the present invention, the illuminating unit 21 can be omitted.

The test unit 20 employs the camera unit 22 to test the presence of a defect, such as fine foreign materials attached to the metal mask (MM). Therefore, as the camera 22 approaches the metal mask (MM) to be tested, the test can be more precisely performed.

In addition, the mask defect test apparatus 100 further includes a transfer unit 60 that moves the test unit 20 in a parallel direction with respect to the tension jig unit 30. However, aspects of the present invention are not limited thereto, and a transfer unit 60 can transfer the tension jig unit 30 rather than the test unit 20 in a parallel direction with respect to the test unit 20.

Further, a vertical distance (d1) between the metal mask (MM) located on the supporter 31 of the tension jig unit 30 and the test unit 20 is formed to be equal to or shorter than a vertical distance (d2) between the clamp part 32 and the tension part 33 of the tension jig unit 30, and the test unit 20. In other words, the clamp part 32 and the tension part 33 are disposed to be equal to or farther in a vertical direction from the test unit 20 than the metal mask (MM) located on the supporter 31.

Therefore, even though the test unit 20 maximally approaches the metal mask (MM) in order to precisely observe the metal mask (MM), the test unit 20 stably observes the edge of the metal mask (MM) without colliding with the clamp part 32 fixing the metal mask (MM) and the tension part 33, making it possible to more accurately test for the presence of a defect.

Figure 4:
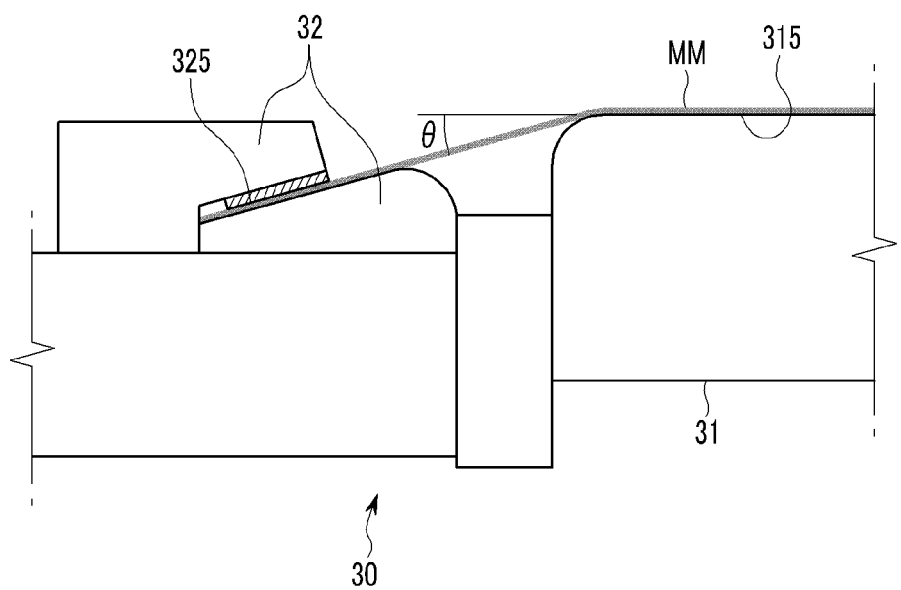
FIG. 4 is a partial enlarged view of the tension jig unit of FIG. 1.

FIG. 4 illustrates a structure of the tension jig unit 30 to stably fix the metal mask (MM) while the clamp part 32 and the tension part 33 of the tension jig unit 30 are disposed at a height equal to or lower than the metal mask (MM) located on the supporter 31. According to aspects of the present invention, the tension part 33 is located below the clamp part 32, and therefore the clamp part 32 will be described.

As shown in FIG. 4, the metal mask (MM) located on the supporter 31 is bent at a predetermined angle at the edge of the supporter 31, such that the metal mask is fixed to the clamp part 32. The predetermined angle ($\theta$) is in the range of 10° to 30°.

If the angle ($\theta$) of the bend of the metal mask (MM) at the edge of the supporter 31 is smaller than 10°, it is difficult for the height of the clamp part 32 to be located at a height equal to or lower than the metal mask (MM) located on the supporter 31. On the other hand, if the angle ($\theta$) of the bend of the metal mask (MM) at the edge of the supporter 31 is larger than 30°, the bent portion of the metal mask (MM) can be deformed or damaged due to the tension force applied to the metal mask (MM) by the tension part 33 (shown in FIG. 2). In addition, if the angle ($\theta$) of the bend of the metal mask (MM) at the edge of the supporter 31 is larger than 30°, the metal mask (MM) located on the central portion of the supporter 31 can be loose, such that the test unit 20 does not precisely test the metal mask (MM).

Moreover, a fixing surface 325 of the clamp part 32, which fixes the edge of the metal mask (MM), is formed at a predetermined inclined angle with respect to the surface 315 of the supporter 31 on which the metal mask (MM) is located. Herein, the predetermined inclined angle is in the range of 10° to 30° as for the above-mentioned predetermined angle ($\theta$).

Therefore, the clamp part 32 can be stably fixed by bending the metal mask (MM) once while having a height equal to or lower than the metal mask (MM) on which the supporter 31 is located. With the above-mentioned configuration, the mask defect test apparatus 100 can more precisely and stably test for the presence of a defect of the metal mask (MM).

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A mask defect test apparatus, comprising:
    a tension jig unit including a supporter on which a metal mask to be tested is located, a clamp part disposed at both sides of the supporter to fix opposite edges of the metal mask, and a tension part to apply a tension force to the metal mask fixed by the clamp part; and
    a test unit to test the metal mask fixed by the tension jig unit, the test unit comprising a camera unit,
    wherein a shortest vertical distance between the metal mask located on the supporter and the camera unit is less than or equal to a shortest vertical distance between the tension jig unit and the camera unit.

2. The mask defect test apparatus of claim 1, wherein the metal mask located on the supporter is bent at an edge of the supporter at a predetermined angle, such that the metal mask is fixed to the clamp part.

3. The mask defect test apparatus of claim 2, wherein the predetermined angle is in the range of 10° to 30°.

4. The mask defect test apparatus of claim 1, wherein:
    a fixing surface of the clamp part fixing an edge of the opposite edges of the metal mask has a predetermined inclined angle with respect to a surface of the supporter on which the metal mask is located.

5. The mask defect test apparatus of claim 4, wherein the predetermined inclined angle is in the range of 10° to 30°.

6. The mask defect test apparatus of claim 1, wherein:
    the tension part pulls the clamp part to apply the tension force to the metal mask.

7. The mask defect test apparatus of claim 1, further comprising:
a transfer unit to transfer one of the test unit or the tension jig unit in a parallel direction with respect to the other of the test unit or the tension jig unit.

8. The mask defect test apparatus of claim 1, wherein:
the test unit includes the camera unit to detect a defect of the metal mask located on the supporter, and an illuminating unit disposed around the camera unit to illuminate the metal mask.

9. The mask defect test apparatus of claim 1, wherein the shortest vertical distance between the metal mask and the camera unit is less than or equal to a shortest vertical distance between the clamp part and the camera unit.

10. The mask defect test apparatus of claim 1, wherein the shortest vertical distance between the metal mask and the camera unit is less than or equal to a shortest vertical distance between the tension part and the camera unit.

* * * * *